(12) United States Patent
Lai et al.

(10) Patent No.: US 12,519,035 B2
(45) Date of Patent: Jan. 6, 2026

(54) SEMICONDUCTOR DEVICE AND METHOD OF MAKING

(71) Applicant: TAIWAN SEMICONDUCTOR MANUFACTURING COMPANY, LTD., Hsinchu (TW)

(72) Inventors: Chih-Yu Lai, Hsinchu (TW); Chih-Liang Chen, Hsinchu (TW); Chi-Yu Lu, Hsinchu (TW); Shang-Hsuan Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 949 days.

(21) Appl. No.: 17/466,417

(22) Filed: Sep. 3, 2021

(65) Prior Publication Data
US 2023/0008866 A1    Jan. 12, 2023

Related U.S. Application Data

(60) Provisional application No. 63/219,633, filed on Jul. 8, 2021.

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 25/0657* (2013.01);
(Continued)

(58) Field of Classification Search
CPC . H01L 23/481; H01L 23/485; H01L 23/5286; H01L 23/5226; H01L 23/49827; H01L 23/5384; H01L 21/76898; H01L 21/823475; H01L 21/823871; H01L 21/8238–823892; H01L 25/0657; H01L 27/0207; H01L 27/0688; H01L 27/088;
(Continued)

(56) References Cited

U.S. PATENT DOCUMENTS 7,260,442 B2    8/2007  Hwang et al.
9,256,709 B2    2/2016  Yu et al.
(Continued)

*Primary Examiner* — Jonathan Han
(74) *Attorney, Agent, or Firm* — Hauptman Ham, LLP

(57) ABSTRACT

A semiconductor device includes a substrate, a first cell having a first functionality, and a second cell having a second functionality. The first cell includes a first portion on a first side of the substrate, wherein the first portion includes a first conductive element; a second portion on a second side of the substrate, wherein the second portion includes a second conductive element; and a first conductive via extending through the substrate and electrically connecting the first conductive element to the second conductive element. The second cell includes a third portion on the first side of the substrate, wherein the third portion includes a third conductive element; a fourth portion on the second side of the substrate, wherein the fourth portion includes a fourth conductive element; and a second conductive via extending through the substrate and electrically connecting the third conductive element to the fourth conductive element.

13 Claims, 14 Drawing Sheets

(51) Int. Cl.
*H01L 25/065* (2023.01)
*H10D 88/00* (2025.01)
*H10D 89/10* (2025.01)

(52) U.S. Cl.
CPC .............. *H10D 88/00* (2025.01); *H10D 89/10* (2025.01); *H01L 2225/06544* (2013.01)

(58) Field of Classification Search
CPC ... H01L 27/092–0928; H01L 27/11807; H01L 2225/06541–06544; H01L 2225/06548; H01L 2224/02372; H01L 2224/05009; H01L 2224/05025; H01L 2224/05087; H01L 2224/0509; H01L 2224/0557; H01L 2224/08146; H01L 2224/13009; H01L 2224/13025; H01L 2224/16146; H01L 2224/29009; H01L 2224/29025; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 29/04–045; H01L 29/16–1608; H01L 29/18–185; H01L 29/22–2206; H01L 29/36–365; H01L 2924/1437; H01L 2924/1436–14369; H01L 28/40–92; H01L 2924/1451; H01L 27/3262; H01L 27/1218; H01L 27/1225; H01L 27/1251; H01L 27/3276; H01L 27/1255; H01L 27/323; H01L 29/78675; H01L 29/7869; H01L 2224/16225; H01L 27/124; H01L 27/3258; H01L 27/0694; H01L 21/0259; H01L 21/8221; H01L 21/823412; H01L 23/5283; H01L 29/0665; H01L 29/41733; H01L 29/42392; H01L 29/66742; H01L 29/78696; H01L 29/0673; H01L 29/775; H01L 23/528; H01L 21/823431; H01L 21/823821; H01L 27/0886; H01L 27/0922; H01L 27/0924; B81C 2203/0728; B81C 2203/0735; B81C 2203/0742; H10B 20/40–50; H10B 53/00–50; H10B 41/00–70; H10B 43/00–50; H10B 51/00–50; H10B 63/00–845; H10B 10/00–18; H10B 12/00–50; H10B 69/00; G11C 11/41–419; G11C 11/401–4099; G11C 11/5621–5642; G11C 14/0009–0045; G11C 2211/4016; G11C 16/00–349; G11C 2216/06–10; G11C 2216/12–30; G02F 1/136286; G02F 1/136227; G06F 30/392; G06F 30/394; G06F 30/398; B82Y 10/00; H10D 88/00; H10D 89/10; H10D 84/8311; H10D 84/0149; H10D 84/0186; H10D 84/038; H10D 84/851
See application file for complete search history.

(56) References Cited

U.S. PATENT DOCUMENTS

| | | | |
|---|---|---|---|
| 2010/0238709 A1* | 9/2010 | Eun | G11C 13/003 365/175 |
| 2011/0156026 A1* | 6/2011 | Yamazaki | H10D 99/00 257/43 |
| 2013/0314074 A1* | 11/2013 | Takahashi | G01R 1/06766 324/110 |
| 2014/0040838 A1 | 2/2014 | Liu et al. | |
| 2015/0021789 A1* | 1/2015 | Lin | H01L 21/76898 438/118 |
| 2015/0278429 A1 | 10/2015 | Chang | |
| 2020/0328188 A1* | 10/2020 | Liu | G11C 5/025 |
| 2022/0005820 A1* | 1/2022 | Kim | H10B 43/27 |

* cited by examiner

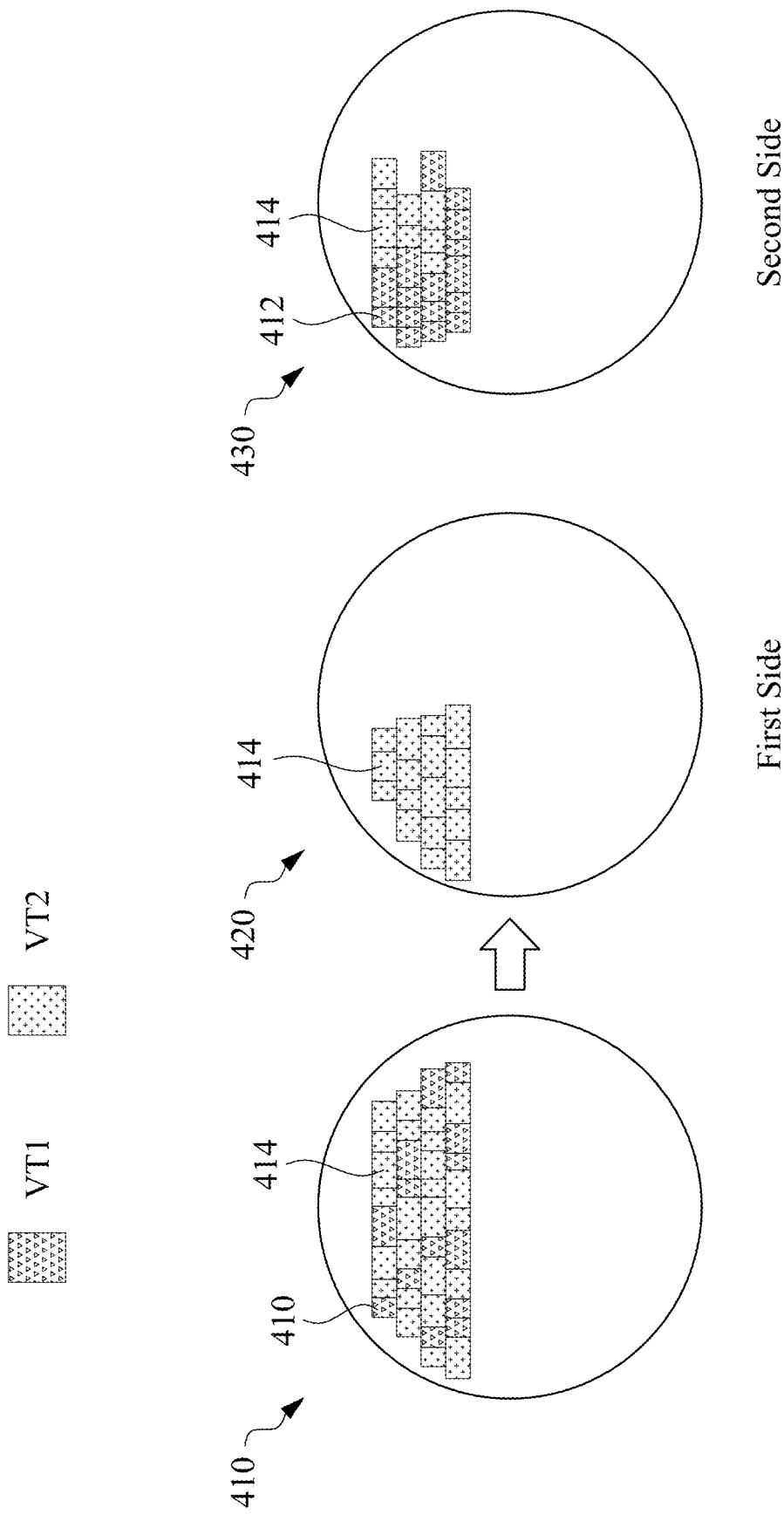

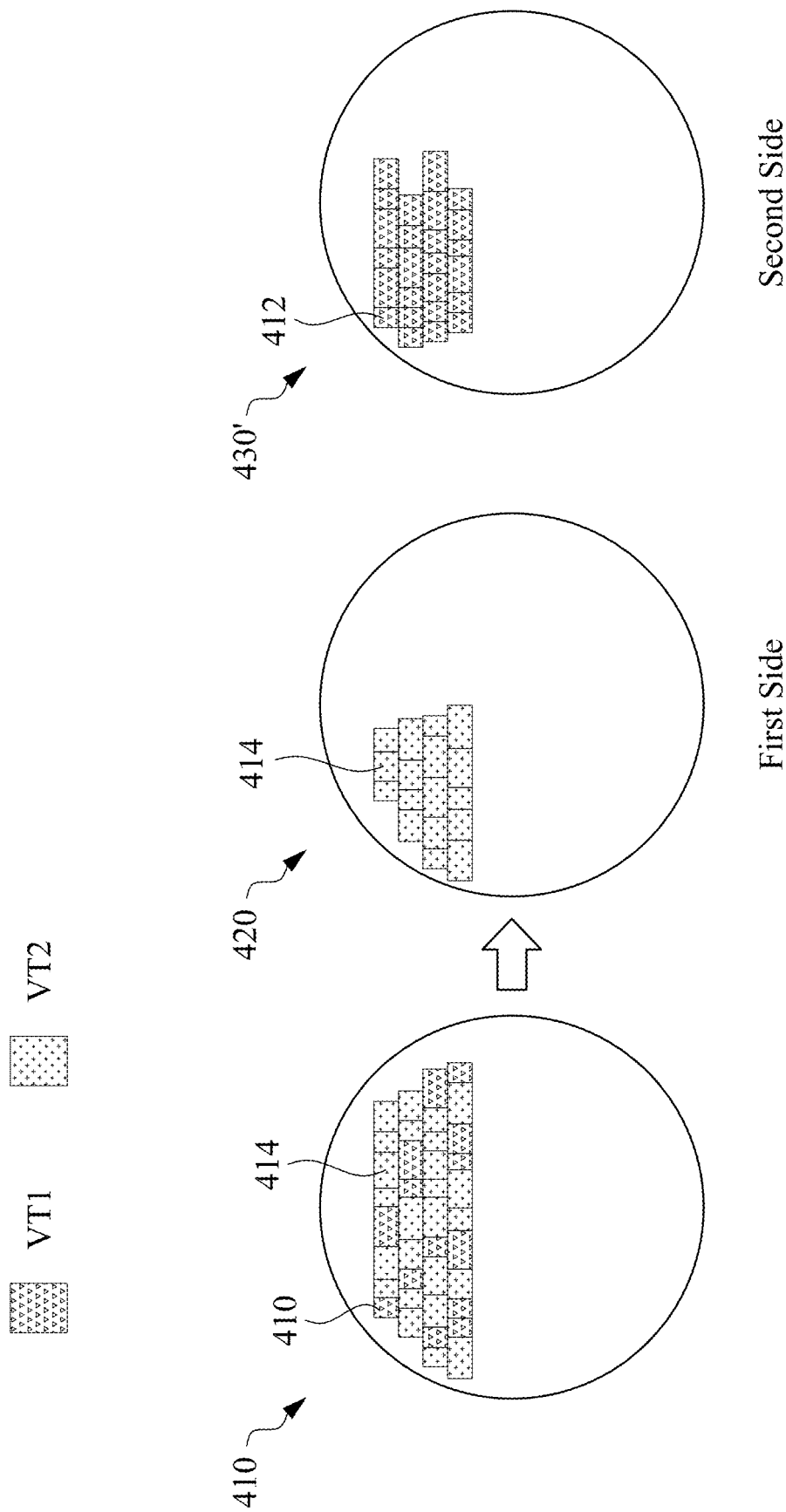

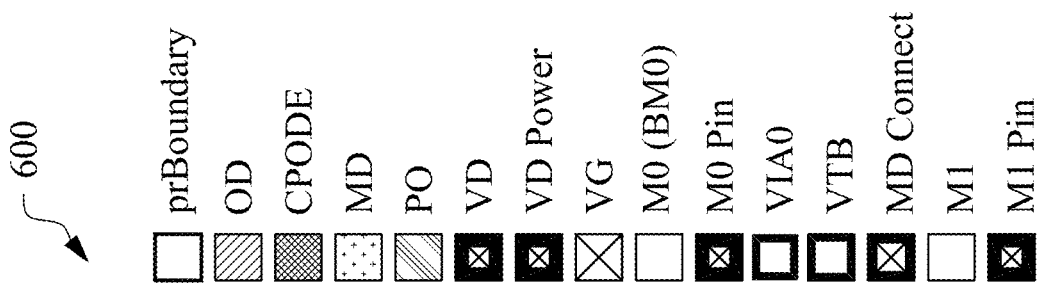
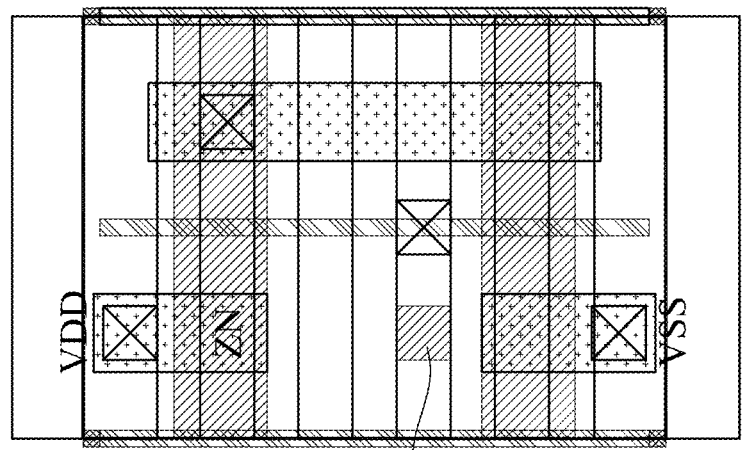
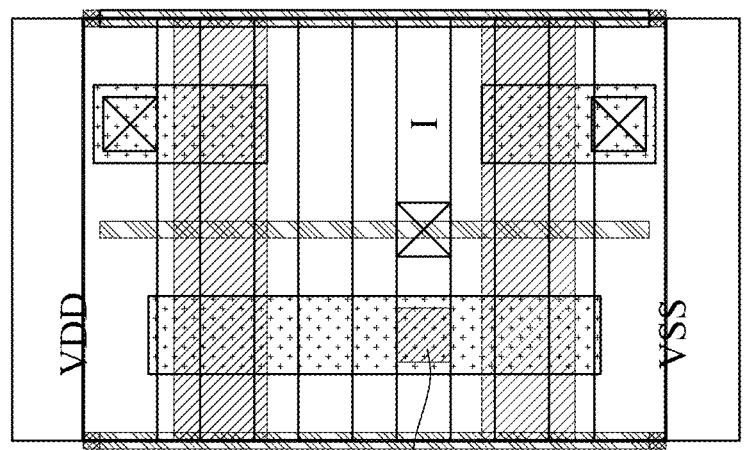
Fig. 6B

SEMICONDUCTOR DEVICE AND METHOD OF MAKING

PRIORITY CLAIM AND CROSS-REFERENCE

The current application claims priority to provisional application 63/219,633 filed Jul. 8, 2021, the entire contents of which are incorporated herein by reference in their entirety.

This application is related to U.S. application Ser. No. 17/214,194, filed Mar. 26, 2021 and to U.S. application Ser. No. 17/231,527, filed Apr. 15, 2021, both of which are hereby incorporated by reference in their entireties.

BACKGROUND

As technology nodes continue to shrink routing for interconnect structures becomes more difficult. Three dimensional integrated circuits (3DICs) involve stacking devices in a vertical direction and electrically connecting the devices together, for example, using a through silicon via (TSV). In a 3DIC structure, a device is formed on one side of a substrate. The 3DIC reduces an area for the integrated circuit (IC) in a planar direction.

In another approach, interconnect structures, such as routing lines and power lines are formed on one side of a substrate and connected to a device on an opposite side of the substrate, for example using a TSV. The interconnect structures on an opposite side of the substrate from the device increases an area usable for routing, which increases routing options and reduces an area of the IC in the planar direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a plurality of plan views of a wafer in accordance with some embodiments.

FIG. 4B is a plurality of plan views of a wafer in accordance with some embodiments.

FIG. 6B are layout diagrams of a semiconductor device in accordance with some embodiments.

DETAILED DESCRIPTION

Figure 1:
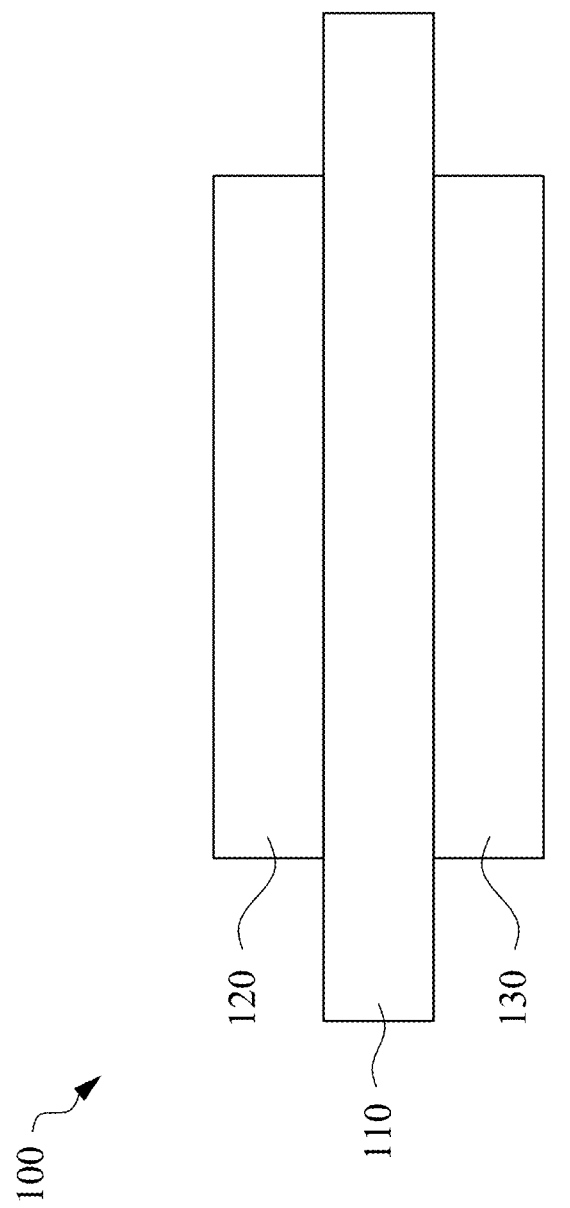
FIG. 1 is a cross-sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes continue to shrink, three dimensional integrated circuits (3DICs), fin field effect transistors (FinFETs), gate all around (GAA) transistors, and backside routing structures alone are unable to keep up with the demand for reduced device area. Amphi-field effect transistors (amphi-FETs) are usable to improve routing options for interconnect structures, which permits further device size reduction. An amphi-FET includes active devices formed on both sides of a substrate. In contrast, a 3DIC includes two devices formed on separate substrates; and the separate substrates are then bonded together. The improved routing options in an amphi-FET means that increasing device size unnecessarily to accommodate connections between elements in the device is reduced or avoided.

The active devices in the amphi-FET are electrically connected using conductive elements extending through the substrate. For example, a gate structure on a first side of the substrate is electrically connected to a gate structure on a second side of the substrate by a gate via extending through the substrate. Similarly, a source/drain (S/D) contact on the first side of the substrate is electrically connected to an S/D contact on the second side of the substrate by an S/D connect via extending through the substrate. Due to these connections through the substrate, a signal, such as a power signal applied on one side of the substrate is able to transfer to the other side of the substrate without including additional routing or through substrate via (TSV) structures. For example, a ground signal connected to an S/D contact on the first side of the substrate is transferred to the second side of the substrate by the S/D connect via to the S/D contact on the second side of the substrate. The ground voltage is then usable on the second side of the substrate without providing a power rail for the ground voltage (or a TSV structure) on the second side of the substrate.

Integrated circuits (ICs) are often designed using cells, which include active devices and connection structures in order to implement an intended function. In some embodiments, a cell includes a single active device. In some embodiments, a cell includes multiple active devices. The ability to efficiently share signals and power from one side of the substrate to the other side of the substrate makes more routing tracks in a cell available for routing signals within the cell and into and out of the cell. Thus, a size of the cell is not unnecessarily increased merely to provide sufficient connections for the cell to function properly. In some instances, a gate density of a device including amphi-FETs is greater than 1.5 times a gate density of a device including active devices on a single side of the substrate. Gate density is a measure of how closely gate structures in a cell are spaced from one another. Gate density is commonly used to describe how efficiently the space within the cell is utilized. Increasing the cell size merely to provide routing options reduces gate density. In some instances, the gate density increase due to the use of amphi-FETs is more than 1.6 times the gate density of a device including active devices on a single side of the substrate.

This significant size reduction helps to keep pace with Moore's Law and also helps with reduced power consumption and increased device speed. The reduced power consumption is a result of having shorter distances between elements, so less power is lost to resistance and heating of conductive lines and vias in the amphi-FET device. The increased device speed results from being able to increase a size of active regions of the cell because less space within the cell is occupied by interconnect elements.

Further to the above size reduction, selectively arranging cells for the amphi-FET on different sides of the substrate helps to further increase density of devices and reduce overall size of the semiconductor device. For example, grouping cells have the similar characteristics such as gate pitch or threshold voltage on a same side of a substrate, alignment of devices and routing schemes are simplified. The simplified alignment and routing schemes helps to reduce spacing between components to reduce the overall size of the semiconductor device.

FIG. 1 is a cross-sectional view of a semiconductor device 100 in accordance with some embodiments. The semiconductor device 100 includes a substrate 110. A first cell 120 is on a first side of the substrate 110. A second cell 130 is on a second side of the substrate 110 opposite to the first side. The first cell 120 is electrically connected to the second cell 130 through the substrate 110, as discussed below. In some embodiments, the first cell 120 has a same functionality as the second cell 130. In some embodiments, the first cell 120 has a different functionality from the second cell 130. In some embodiments, the first cell 120 and the second cell 130 combine to implement a designed functionality. In some embodiments, the first cell 120 includes components having a first threshold voltage and the second cell 130 includes components having a second threshold voltage different from the first threshold voltage. In some embodiments, the first cell 120 includes components having a first gate pitch, also called a poly pitch, and the second cell 130 includes components having a second gate pitch different from the first gate pitch. In some embodiments, the first cell 120 includes components having a first channel dimension and the second cell 130 includes components having a second channel dimension different from the first channel dimension. One of ordinary skill in the art will recognize that two cells are included in FIG. 1 as an example, and that the current description is not limited to merely two cells.

Figure 2:
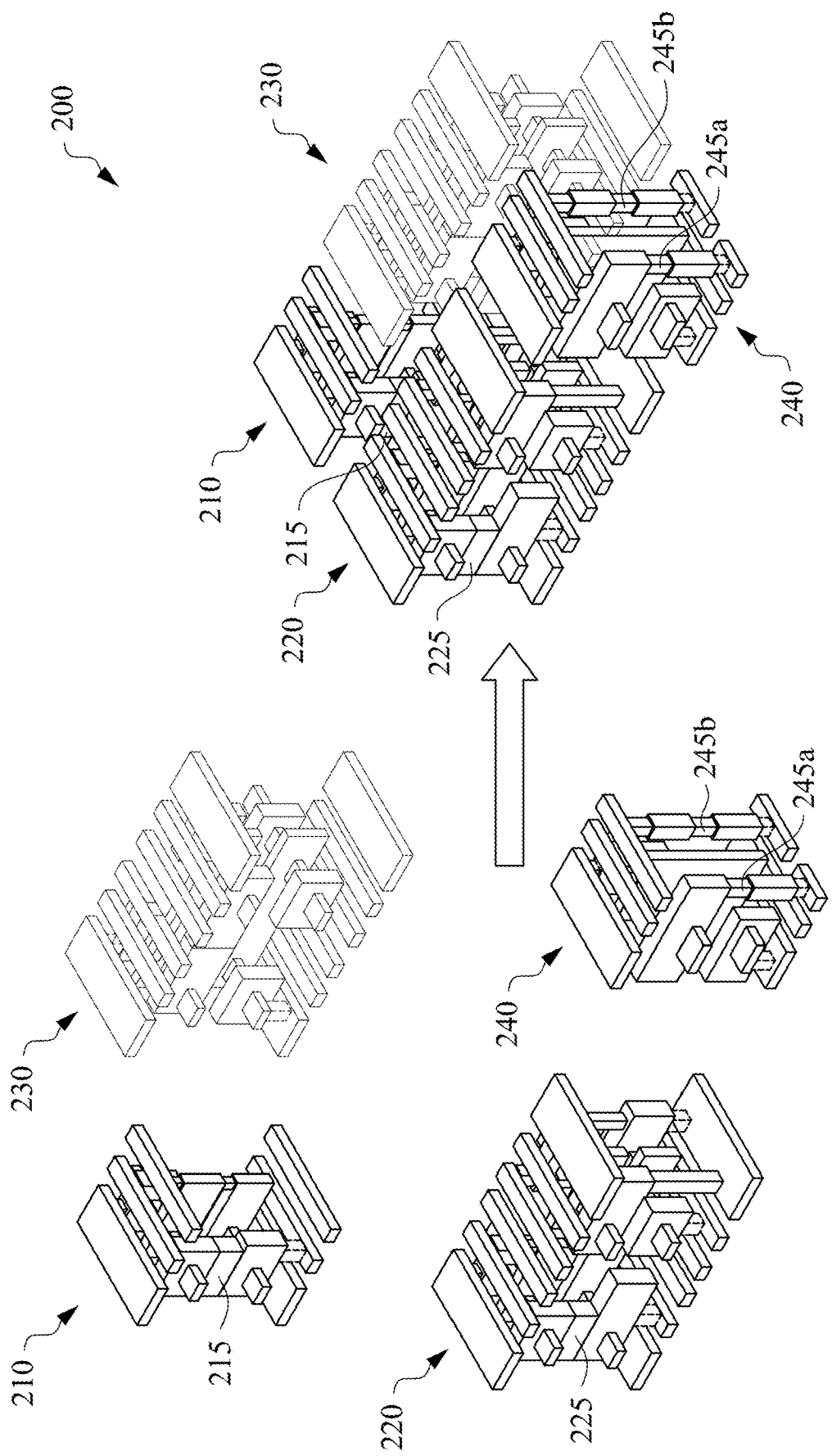
FIG. 2 is a plurality of perspective views of a semiconductor device in accordance with some embodiments.

FIG. 2 is a plurality of perspective views of a semiconductor device 200 in accordance with some embodiments. A plurality of cells 210, 220, 230 and 240 are combined to form the semiconductor device 200. Each of the plurality of cells 210, 220, 230 and 240 includes an amphi-FET structure including nanosheet (NS) gate structures. Details of the cells 210, 220, 230 and 240 are omitted for the sake of brevity. The substrate, e.g., substrate 110 (FIG. 1), is not included in FIG. 2 for the sake of clarity of the drawings.

The cell 210 includes a source/drain (S/D) connect via 215 extending through the substrate (not shown) to electrically connect a first S/D electrode on a first side of the substrate to a second S/D electrode on a second side of the substrate. The cell 210 is a horizontal stacked cell, includes two signal lines, and has a large width channel. In some embodiments, the S/D connect via 215 is omitted and a different type of through substrate via (TSV) is included in the cell 210, e.g., a gate via.

The cell 220 includes a S/D connect via 225 extending through the substrate to electrically connect a third S/D electrode on the first side of the substrate to a fourth S/D electrode on the second side of the substrate. The cell 220 is a vertical mirror cell, including four signal lines, and has a small width channel. Therefore, the cell 220 is vertical mirrored, includes 4 signal lines, and has a small width of the channel. In some embodiments, the S/D connect via 225 is omitted and a different type of TSV is included in the cell 220, e.g., a gate via.

The cell 230 includes a gate via electrically connecting a first gate electrode on the first side of the substrate to a second gate electrode on the second side of the substrate. The gate via is not labeled because the gate via is obscured by the S/D electrode of the cell 230. Similar to the cell 220, the cell 230 is vertical mirrored, includes 4 signal lines, and has a small width of the channel. In some embodiments, the gate via is omitted and different type of TSV is included in the cell 230, e.g., an S/D connect via.

The cell 240 includes a first TSV 245a electrically connecting a fifth S/D electrode on the first side of the substrate to a first signal line on the second side of the substrate. The cell 240 further includes a second TSV 245b electrically connecting a sixth S/D electrode on the second side of the substrate to a second signal line on the first side of the substrate. Similar to the cell 210, the cell 240 is a horizontal stacked cell, includes two signal lines, and has a large width channel. In some embodiments, at least one of the first TSV 245a or the second TSV 245b is omitted and different TSV, e.g., a gate via, is included in the cell 240.

The semiconductor device 200 includes an arrangement of cells 210, 220, 230 and 240 into a single device structure. The cell 210 is aligned with the cell 220 in a first direction, and is aligned with the cell 230 in a second direction perpendicular to the first direction. The cell 220 is aligned with the cell 210 in the first direction, and is aligned with the cell 240 in the second direction. This arrangement results in alternating cells of a horizontal stacked cell, including two signal lines, and having a large width channel and vertical mirrored cells, including 4 signal lines, and having a small width of the channel in each of the first direction and the second direction. In some embodiments, the arrangement of different layout types of cells is called a mixed cell.

Using mixed cell arrangements, density of the components in the semiconductor device 200 is increased in comparison with arrangements that include all cells of the same layout type. For example, the layout arrangement of the semiconductor device 200, i.e., alternating different cell types, results in a gate density greater than 1.5 times more than a gate density of a device including active devices on a single side of the substrate. Gate density is a measure of how closely gate structures in a cell are spaced from one another. Gate density is commonly used to describe how efficiently the space within the cell is utilized. In some embodiments, the layout arrangement of the semiconductor device 200 is able to achieve a gate density 1.79 times greater than the gate density of the device including active devices on a single side of the substrate. As the gate density increases, the overall size of the semiconductor device 200 is able to be reduced.

Figure 3A:
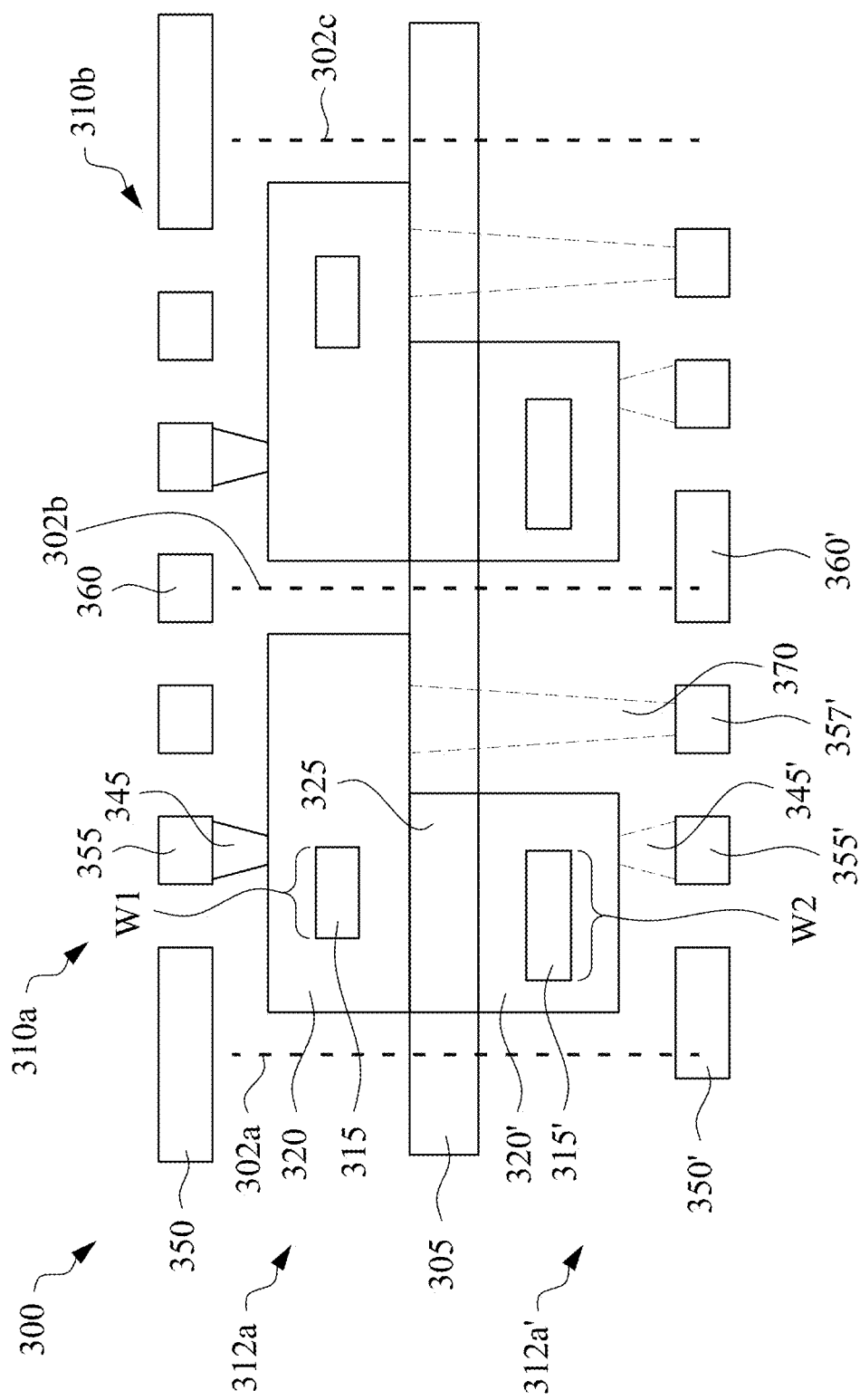
FIG. 3A is a cross-sectional view of a semiconductor device in accordance with some embodiments.

FIG. 3A is a cross-sectional view of a semiconductor device 300 in accordance with some embodiments. The semiconductor device 300 includes a first cell 310a and a second cell 310b. The first cell 310a and the second cell 310b includes similar components, so only the components in the first cell 310a are labeled for clarity of the drawing.

The first cell 310a includes a first portion 312a on a first side of a substrate 305. The first cell 310a includes a first active area 315 is on a first side of the substrate 305. The first active area 315 includes one or more NS. A first S/D electrode 320 surrounds the portion of the first active region 315 seen in the cross-sectional view and extends between the first active region 315 and the substrate 305.

The first cell 310a includes a second portion 312a' on a second side of the substrate 305. A second active region 315' is on the second side of the substrate 305. The second active region 315' includes one or more NS. A second S/D electrode 320' surrounds the portion of the second active region 315' seen in the cross-sectional view and extends between the second active region 315' and the substrate 305. The first S/D electrode 320 is electrically connected to the second S/D electrode 320' by an S/D connect via 325 that extends through the substrate 305.

A first via 345 electrically connects the first S/D electrode 320 to a first conductive line 355. The first conductive line 355 is able to carry a signal to or from the first S/D electrode 320. In some embodiments, the first via 345 is omitted and the first conductive line 355 is not directly connected to the first S/D electrode 320. In some embodiments, the first S/D electrode 320 is electrically connected to a first power rail 350 by a via. In some embodiments, the first power rail 350 carries a reference voltage, e.g., ground. In some embodiments, the first power rail 350 carries a source voltage, e.g., VDD.

A second via 345' electrically connects the second S/D electrode 320' to a second conductive line 355'. The second conductive line 355' is able to carry a signal to or from the second S/D electrode 320'. In some embodiments, the second via 345' is omitted and the second conductive line 355' is not directly connected to the second S/D electrode 320'. In some embodiments, the second S/D electrode 320' is electrically connected to a second power rail 350' by a via. In some embodiments, the second power rail 350' carries a reference voltage, e.g., ground. In some embodiments, the second power rail 350' carries a source voltage, e.g., VDD.

A jump via 370 electrically connects the first S/D electrode 320 to a third conductive line 357' on the second side of the substrate 305. The jump via 370 extends through the substrate 305 and directly connects to the third conductive line 357' without electrically connecting to the second S/D electrode 320'. The jump via 370 permits the first S/D electrode 320 to receive signals from the second side of the substrate 305 in order to reduce routing complexity on the first side of the substrate 305. In some embodiments, the jump via 370 is omitted.

In some embodiments, the first via 345, the second via 345', and the jump via 370 independently include a fill material including cobalt (Co), tungsten (W), copper (Cu), ruthenium (Ru), titanium (Ti), tantalum (Ta), or alloys thereof, or other conductive materials. In some embodiments, the first via 345, the second via 345', and the jump via 370 include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, a composition of the first via 345 is a same composition as each of the second via 345', and the jump via 370. In some embodiments, the composition of the first via 345 is different from the composition of at least one of the second via 345' or the jump via 370. In some embodiments, each of the first via 345, the second via 345', and the jump via 370 have a same composition as the S/D connect via 325. In some embodiments, at least one of the first via 345, the second via 345', or the jump via 370 has a different composition from the S/D connect via 325.

In some embodiments, the first conductive line 355, the second conductive line 355', and the third conductive line 357' independently include a fill material including cobalt (Co), tungsten (W), copper (Cu), ruthenium (Ru), titanium (Ti), tantalum (Ta), or alloys thereof, or other conductive materials. In some embodiments, the first conductive line 355, the second conductive line 355', and the third conductive line 357' include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner material. In some embodiments, a composition of the first conductive line 355 is a same composition as each of the second conductive line 355' and the third conductive line 357'. In some embodiments, the composition of the first conductive line 355 is different from the composition of at least one of the second conductive line 355' or the third conductive line 357'. In some embodiments, each of the first conductive line 355, the second conductive line 355', and the third conductive line 357' have a same composition as the S/D connect via 325, the first via 345, the second via 345' and the jump via 370. In some embodiments, at least one of the first conductive line 355, the second conductive line 355' or the third conductive line 357' has a different composition from at least one of the S/D connect via 325, the first via 345, the second via 345' or the jump via 370.

The first S/D electrode 320 and the second S/D electrode 320' include conductive material surround S/D regions of the corresponding active regions. In some embodiments, the S/D regions include doped semiconductor materials. In some embodiments, the S/D regions include silicon. In some embodiments, the S/D regions include a strained material, such as silicon-germanium (SiGe). In some embodiments, the S/D regions are formed by epitaxial processes. In some embodiments, the S/D regions are formed by ion implantation. In some embodiments, the first S/D electrode 320 and the second S/D electrode 320' are formed by deposition. In some embodiments, the first S/D electrode 320 and the second S/D electrode 320' independently include cobalt (Co), tungsten (W), copper (Cu), ruthenium (Ru), titanium (Ti), tantalum (Ta), or alloys thereof, or other conductive materials. In some embodiments, a composition of the first S/D electrode 320 is a same composition as the second S/D electrode 320'. In some embodiments, the composition of the first S/D electrode 320 is different from the composition of the second S/D electrode 320'. In some embodiments, the first S/D electrode 320 and the second S/D electrode 320' include a silicide layer.

A width of the S/D connect via 325 in the substrate 305 is equal to a width of the second S/D electrode 320'. The width is measured in a direction parallel to a top surface of the substrate 305. Maximizing a size of the S/D connect via 325 helps to minimize resistance in the S/D connect via 325, which improves power consumption. The width of the second S/D electrode 320' is less than a width of the first S/D electrode 320. In some embodiments, the width of the second S/D electrode 320' is equal to the width of the first S/D electrode 320.

A width W1 of the first active region 315 is less than a width W2 of the second active region 315'. In some embodiments, the width W2 of the second active region 315' is usable for critical nets. A critical net is a signal path of the semiconductor device that is designed to permit the signal to travel faster than other signal paths. For example, in some embodiments, processing within a logic circuit does not being until a triggering signal is received by the logic circuit. In order to help ensure that the logic circuit timely performs the processing, a critical net is used to permit the signal to reach the logic circuit as quickly as possible. In contrast with the larger width W2, the width W1 of the first active region 315 will have a slower speed, but helps to reduce power consumption. By including different widths on different sides of the substrate 305, the semiconductor device 300 is able to reduce routing complexity, improve critical net routing and improve power efficiency.

The first portion 312a is a horizontal mirror arrangement, including two dedicated signal lines and one shared signal line (shared with the second cell 310b), and has a small width channel. The second portion 312a' is a horizontal mirror arrangement, including two signal lines, and has a large width channel. Since the first cell 310a includes two different types of arrangements within a single cell the first cell 310a is called a hybrid cell, in some embodiments.

The mixed cell arrangement of the semiconductor device 200 (FIG. 2) includes different types of cell arrangements; however, the arrangement of each cell is consistent throughout the cell. In contrast, the hybrid cell arrangement of the semiconductor 300 includes different arrangements within the same cell. The different arrangements within the same cell provides increased flexibility for routing solutions and helps to maximize power efficiency.

Figure 3B:
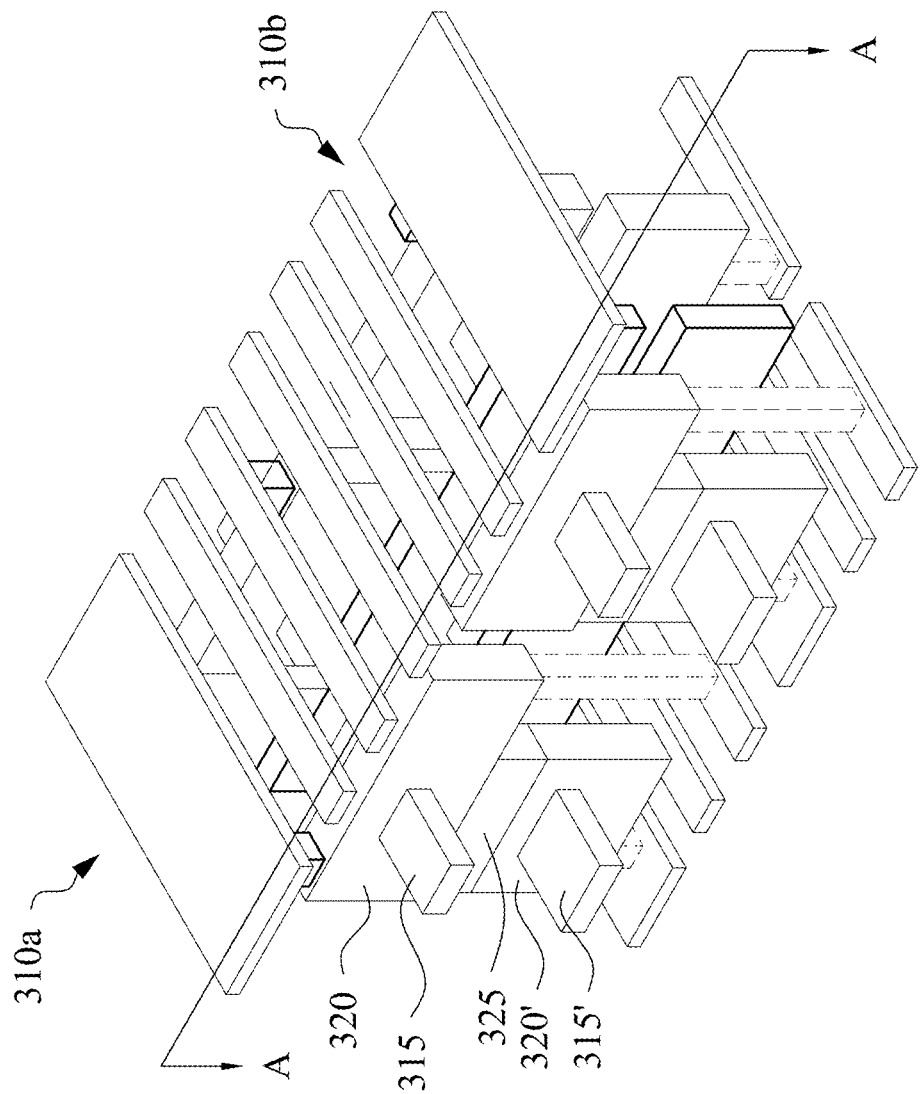
FIG. 3B is a perspective view of a semiconductor device in accordance with some embodiments.

FIG. 3B is a perspective view of the semiconductor device 300 in accordance with some embodiments. Some components of the semiconductor device 300 are not labeled in FIG. 3B for clarity of the drawing. The substrate 305 (FIG. 3A) in not shown in FIG. 3B for clarity of the drawing, but one of ordinary skill in the art would understand the location of the substrate based on the location of the S/D connect via 325. As indicated in FIG. 3B, the first cell 310a includes gate structures and additional S/D structures (not labeled), which are not visible in the cross-sectional view of FIG. 3A. FIG. 3A is a cross-sectional view of the semiconductor device 300 taken along line A-A.

FIG. 4A is a plurality of plan views of a wafer in accordance with some embodiments. A wafer 410 includes a plurality of cells on a single surface of the wafer 410. The plurality of cells include first cells 412 and second cells 414. Components of the first cells 412 operate at a first threshold voltage Vt1. Components in the second cells 414 operate at a second threshold voltage Vt2 different from the first threshold voltage Vt1. In some embodiments, the first threshold voltage Vt1 is higher than the second threshold voltage Vt2. In some embodiments, the second threshold voltage Vt2 is higher than the first threshold voltage Vt1. The operating voltage provided to each of the plurality of cells is based on the threshold voltage of the components within the corresponding cell. Since the first cells 412 and the second cells 414 are spread across the single surface of wafer 410 routing electrical connections to power rails to provide the proper operating voltage to each cell is complex. The complexity of the routing results an increases in the size of the corresponding device and increased production costs.

Using amphi-FET cells, which are able to be formed on both surfaces of the wafer, cells with different threshold voltages are able to be split onto different sides of the wafer. This type of arrangement helps to reduce the complexity of routing to provide operating voltages to the corresponding cells. As a result of the reduced complexity in routing the size of the device is decreased and production costs are reduced. A wafer having a first side 420 includes only the second cells 414 having the second threshold voltage Vt2. None of the cells on the first side 420 have the first threshold voltage Vt1. The wafer includes a second side 430 that includes both the first cells 412 having the first threshold voltage Vt1 and the second cells 414 having the second threshold voltage Vt2. While the second side 430 still includes cells of different threshold voltages, moving some of the second cells 414 to the first side 420 helps with the ability to group cells having a same threshold voltage together. This grouping helps to reduce complexity of the routing of the operating voltage and therefore reduces semiconductor device size and production costs.

FIG. 4B is a plurality of plan views of a wafer in accordance with some embodiments. In contrast with FIG. 4A, FIG. 4B includes a second side 430' including only the first cells 412 having the first threshold voltage Vt1. By limiting each side of the wafer to a single threshold voltage, the routing for the operating voltages are simplified on both sides of the wafer reducing device size and production cost.

While the arrangement in FIG. 4B is preferable for routing of the operating voltage, in some embodiments a number of cells having different threshold voltages is too large to have each side of the wafer include only cells of a certain threshold voltage. In those situations one side of the wafer will include mixed threshold voltages. Further, in some embodiments, more than two different threshold voltages are used. In situations where more than two threshold voltages are included, one side of the wafer will include a mixture of cells with different threshold voltages. One of ordinary skill in the art would recognize that grouping of cells having a same threshold voltage on any side of the wafer will help to reduce complexity of routing to provide the corresponding operating voltage.

Figure 5A:
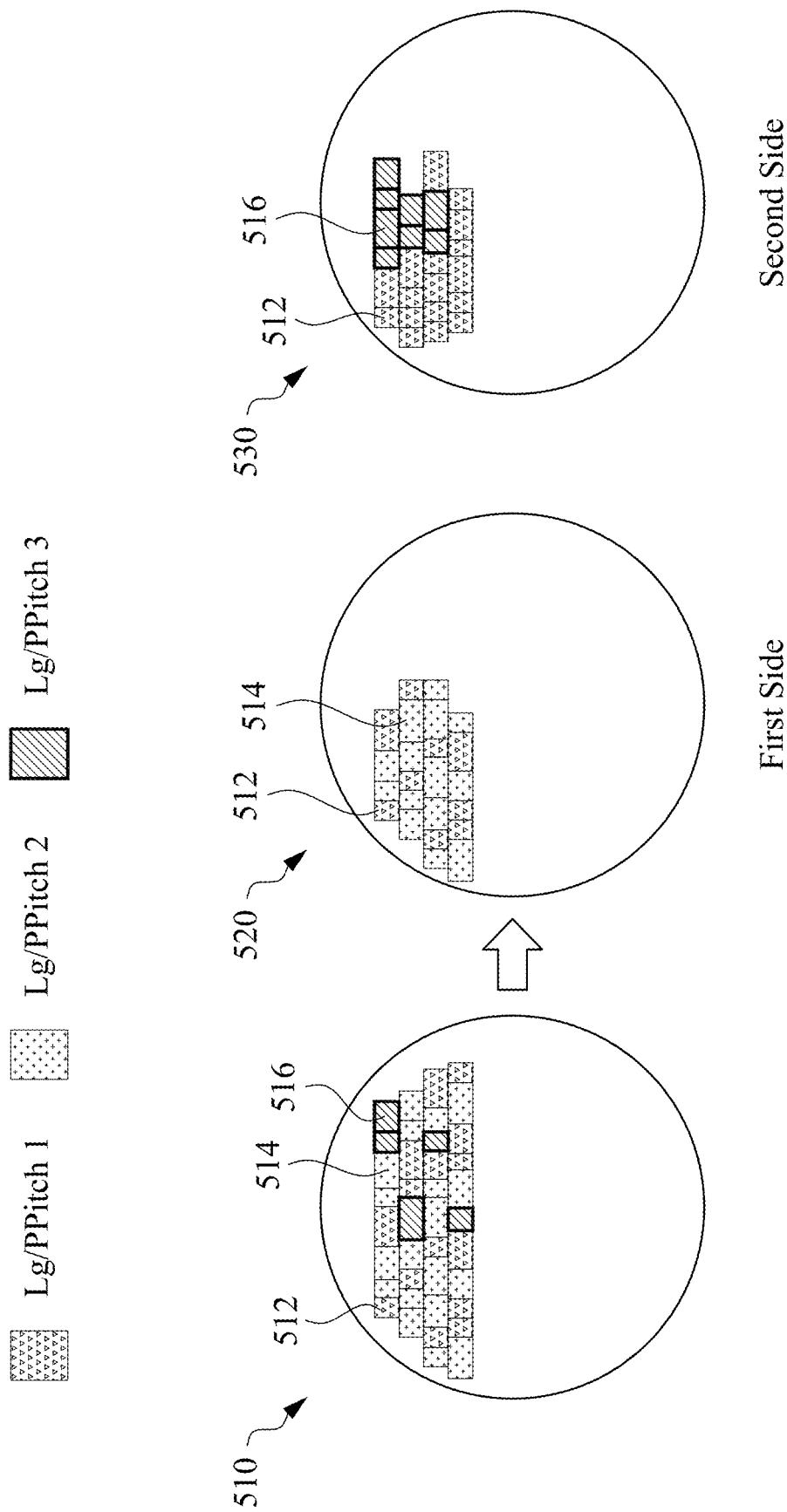
FIG. 5A is a plurality of plan views of a wafer in accordance with some embodiments.

FIG. 5A is a plurality of plan views of a wafer in accordance with some embodiments. A wafer 510 includes a plurality of cells on a single surface of the wafer 510. The plurality of cells include first cells 512, second cells 514 and third cells 516. Components of the first cells 512 have a first poly pitch PP1. Components in the second cells 514 have a second poly pitch PP2 different from the first poly pitch PP1. Components of the third cells 516 have a third poly pitch PP3 different from each of the first poly pitch PP1 and the second poly pitch PP2. The poly pitch is the pitch between locations where gate structure are able to be formed. As the poly pitch is reduced, more gate structures are able to be formed in a same area. In some embodiments, the first poly pitch PP1 is greater than at least one of the second poly pitch PP2 or the third poly pitch PP3. In some embodiments, the second poly pitch PP2 is greater than at least one of the first poly pitch PP1 or the third poly pitch PP3. In some embodiments, the third poly pitch PP3 is greater than at least one of the first poly pitch PP1 or the second poly pitch PP2. Forming cells having different poly pitches on a single side of the wafer 510 increases production complexity and cost because the structures for defining the gate structures for the different cells are difficult or impossible to align across an entirety of the wafer. Production efficiency is improved when features are able to be formed continuously across the wafer 510. However, the differences in the poly pitch for the first cells 512, the second cells 514 and the third cells 516 inhibit the ability to form continuous structures. As a result additional formation and removal processes are used to form the cells having the different poly pitches in comparison with a situation where all cells having a same poly pitch.

Using amphi-FET cells, which are able to be formed on both surfaces of the wafer, cells with different poly pitches are able to be split onto different sides of the wafer. This type of arrangement helps to reduce the complexity of production and production costs. A wafer having a first side 520 includes only the first cells 512 having the first poly pitch PP1 and the second cells 514 having the second poly pitch PP2. None of the cells on the first side 520 have the third poly pitch PP3. The wafer includes a second side 530 that includes both the first cells 512 having the first poly pitch PP1 and the third cells 516 having the third poly pitch PP3. While both the first side 520 and the second side 530 still includes cells of poly pitches, separating cells to reduce the number of different poly pitches on a same side of the wafer helps to reduce production complexity and cost.

Further, selection of which poly pitches to group together also helps to reduce production complexity. In some embodiments, cells having integer multiple poly pitches are grouped together. For example, if the first poly pitch PP1 has a value of 2, the second poly pitch PP2 has a value of 4 and the third poly pitch PP3 has a value of 6, the first cells 512 have an integer multiple poly pitch relationship with each of the second cells 514 and the third cells 516. Production of cells having such an integer multiple relationship helps to reduce production complexity because structure for defining the gate structures are able to be formed at a smallest pitch and then these structures are able to be removed from only the cells having a larger pitch. Therefore, selectively grouping of the cells to be formed on the first side 520 and the second side 530 helps to further reduce production complexity and cost.

Figure 5B:
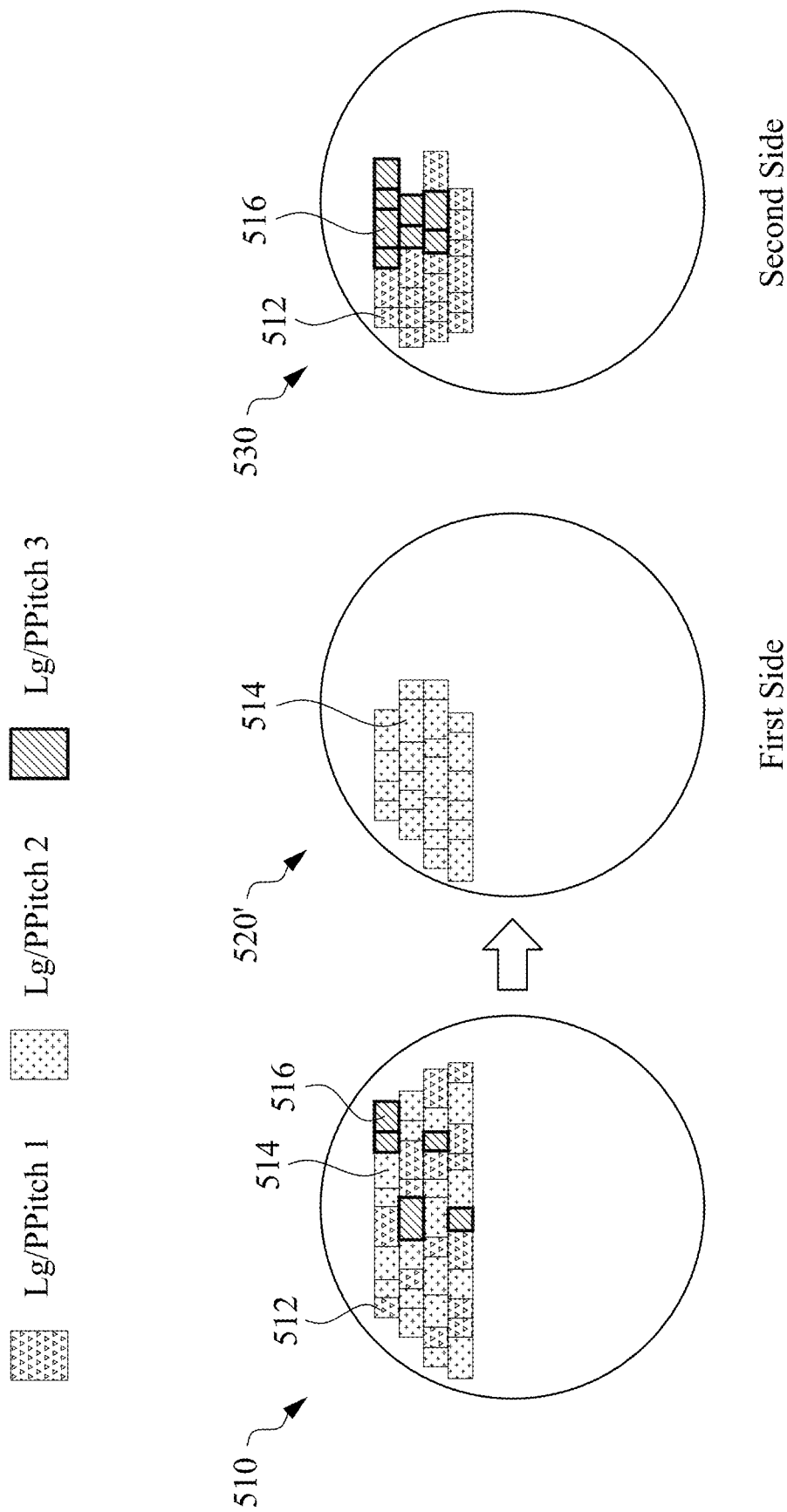
FIG. 5B is a plurality of plan views of a wafer in accordance with some embodiments.

FIG. 5B is a plurality of plan views of a wafer in accordance with some embodiments. In contrast with FIG. 5A, FIG. 5B includes a first side 520' including only the second cells 514 and a second side 530' including only the first cells 512 and the third cells 516. By limiting the first side 520' of the wafer to a single poly pitch, production complexity and cost is reduced.

While the arrangement in FIG. 5B is preferable for routing of the operating voltage, in some embodiments a number of cells having poly pitches is too large to have either side of the wafer include only cells of a poly pitch. In those situations one side of the wafer will include mixed poly pitches on both sides of the wafer. One of ordinary skill in the art would recognize that this description is applicable to wafers including more or less than three different poly pitches.

Figure 6A:
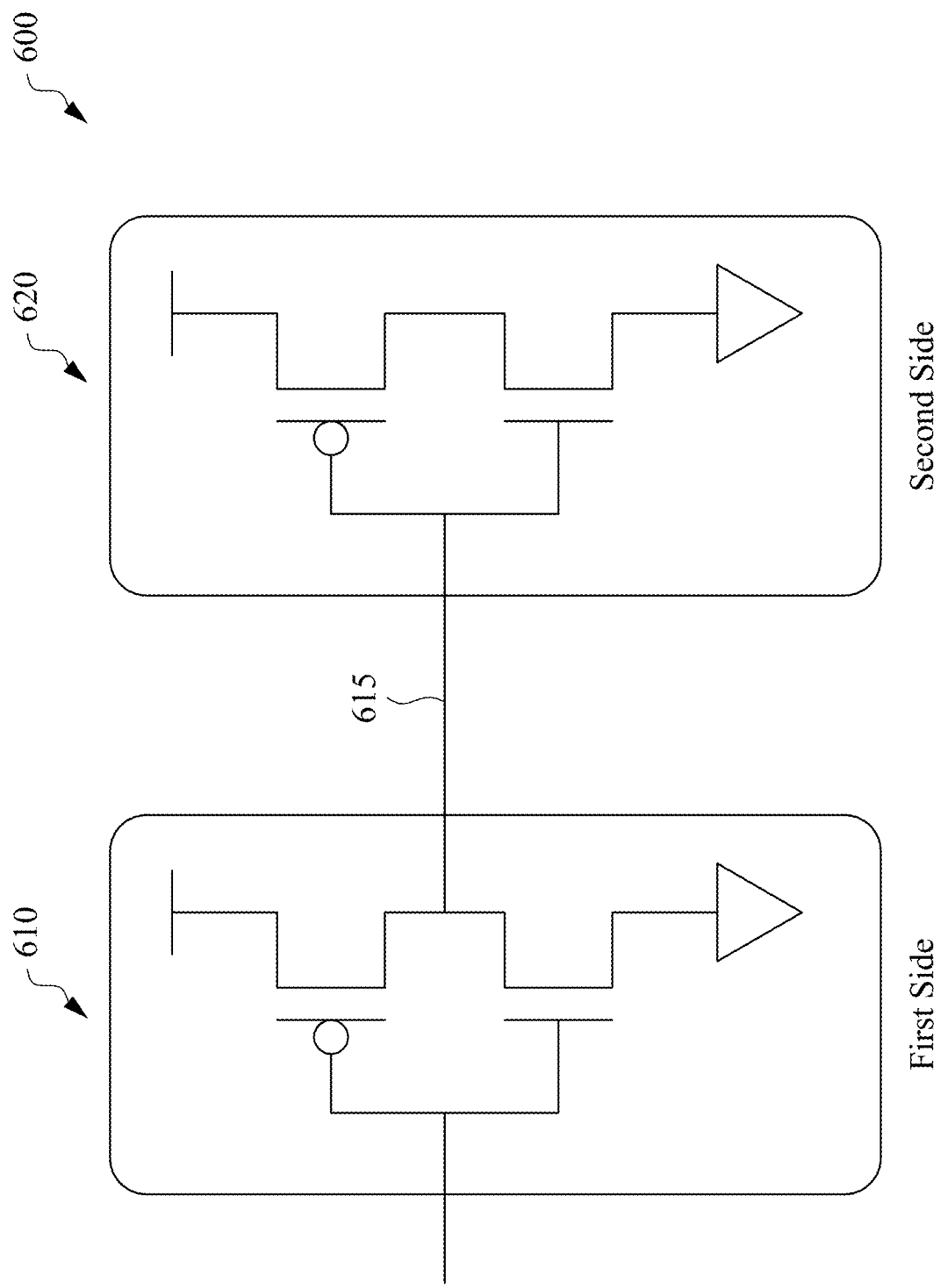
FIG. 6A is a schematic view of a semiconductor device in accordance with some embodiments.

FIG. 6A is a schematic view of a semiconductor device 600 in accordance with some embodiments. The semiconductor device 600 includes a first inverter 610 on a first side of a wafer. The semiconductor device 600 further includes a second inverter 620 on a second side of the wafer opposite the first side of the wafer. Details of the inverter are not described here for the sake of brevity. A TSV 615 electrically connects the drains of the transistors in the first inverter 610 to the gates of the transistors of the second inverter 620.

FIG. 6B are layout diagrams of the semiconductor device 600 in accordance with some embodiments. The layout diagram 610' corresponds to the first inverter 610 in FIG. 6A. The layout diagram 620' corresponds to the second inverter 620 in FIG. 6A. The TSV 615 is electrically connected to a metal contact MD connected to the drains in the first layout diagram 610'. The TSV 615 is electrically connected to a backside metal 0 layer (BMO), which electrically connects to a gate electrode for both transistors by a gate via VG. In some embodiments, an automatic placement and routing (APR) tool is used to select a location of the TSV 615.

In comparison with using an APR tool to establish routing schemes for a single side of the wafer, the APR tool for placing the TSV 615 considers design rules and location on both sides of the wafer in order to select a placement location for the TSV 615 which is able to be reliably manufactured.

The non-limiting example of a single TSV connecting inverters on opposite sides of the wafer is merely used to explain how an APR tool is usable for selecting locations of connections through a substrate in an amphi-FET structure. One of ordinary skill in the art would recognize that the APR tool is usable to form various through substrate connections, such as S/D connect via 215 (FIG. 2), S/D connect via 225, first TSV 245a, second TSV 245b, S/D connect via 325 (FIG. 3A) or jump via 370. During the placement of any connecting element extending through the substrate, the APR tool will consider design rules on both sides of the substrate as well as locations of various elements on both sides of the wafer.

Figure 7A:
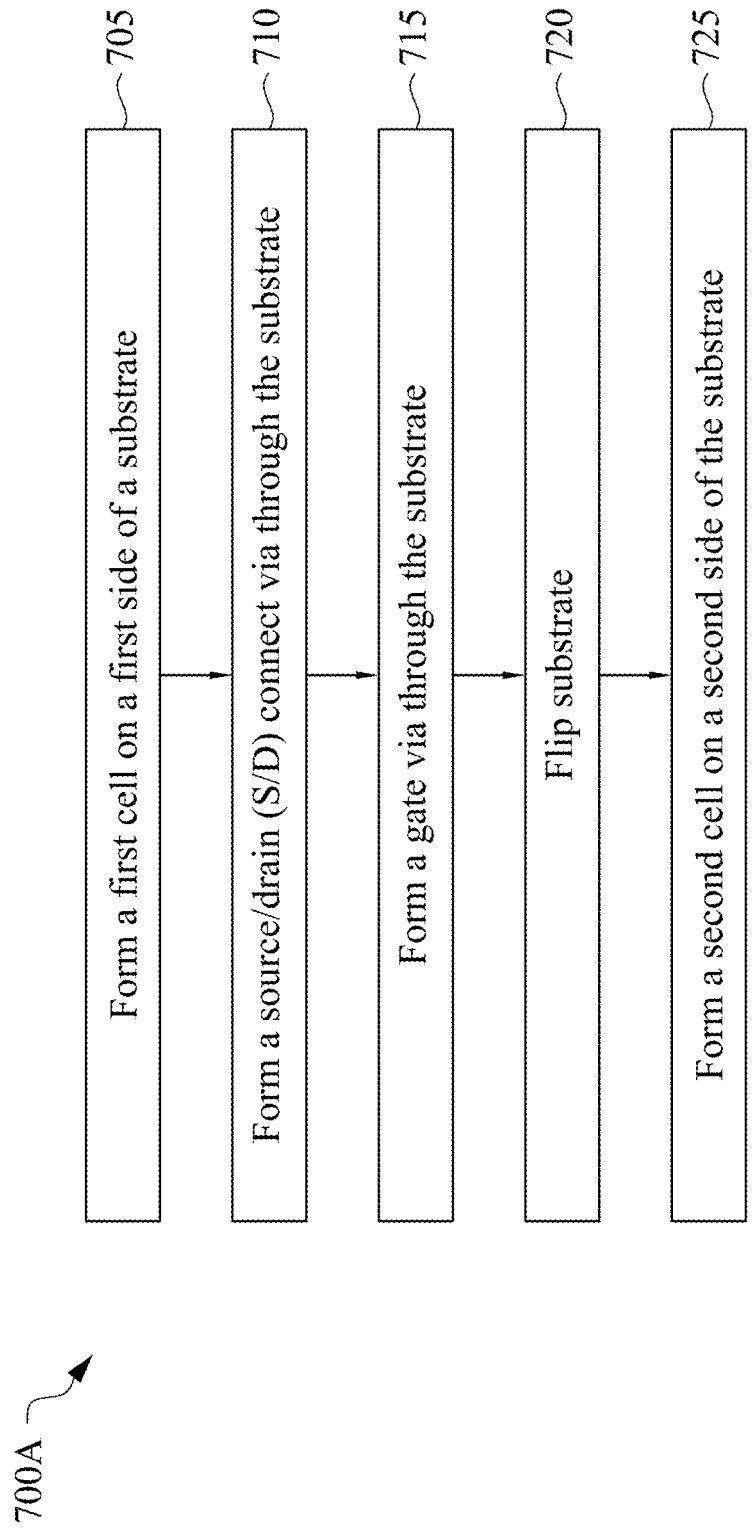
FIG. 7A is a flowchart of a method of making a semiconductor device in accordance with some embodiments.

FIG. 7A is a flowchart of a method 700A of making a semiconductor device in accordance with some embodiments. The operations of the method 700A are able to be performed in a variety of sequences in order to produce the semiconductor device. Some possible variations will be discussed below.

Method 700A includes operation 705, in which a first cell is formed on a first side of substrate. The first cell is formed using a series of deposition and patterning processes. In some embodiments, the deposition processes include chemical vapor deposition (CVD), physical vapor deposition (PVD), atomic layer deposition (ALD), sputtering or another suitable deposition process. In some embodiments, the patterning processes include lithographic and etching processes, such as dry or wet etching. In some embodiments, the first cell includes a nanosheet (NS) and an interconnect structure.

In operation 710, a source/drain (S/D) connect via is formed through the substrate. The S/D connect via is formed by depositing a sacrificial layer, such as a dielectric layer over at least one side of the substrate. In some embodiments where the S/D connect via is formed after the first cell, the sacrificial layer is formed on a single side of the substrate. In some embodiments where the first cell is formed after the S/D connect via, the sacrificial layer is formed on both sides of the substrate. The sacrificial layer and the substrate are etched to form an opening extending through the substrate.

In embodiments that include forming the first cell prior to forming the S/D connect via, the opening exposes a portion of an S/D electrode of the first cell. The opening is then filled by one or more deposition processes in order to form the S/D connect. In some embodiments, the deposition processes include CVD, PVD, ALD, sputtering or another suitable deposition process. In some embodiments, a removal process, such as etching or planarization is performed to remove material of the S/D connect via over a surface of the sacrificial layer farthest from the substrate. In some embodiments, the sacrificial layer is removed from at least one side of the substrate following formation of the S/D connect via. In some embodiments, the S/D connect via has parallel sidewalls and a substantially uniform width. In some embodiments, the S/D connect via has a tapered profile.

In some embodiments, the S/D connect via includes a fill material including cobalt (Co), tungsten (W), copper (Cu), ruthenium (Ru), titanium (Ti), tantalum (Ta), or alloys thereof, or other conductive materials. In some embodiments, the S/D connect via includes a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, the S/D connect via connects to an S/D electrode of a first active region and a second active region through a silicide layer (not shown).

In operation 715, a gate via is formed through the substrate. In some embodiments, the gate via is formed simultaneously with the formation of the S/D connect via. The gate via is formed by depositing a sacrificial layer, such as a dielectric layer over at least one side of the substrate. In some embodiments where the gate via is formed after the first cell, the sacrificial layer is formed on a single side of the substrate. In some embodiments where the first cell is formed after the gate via, the sacrificial layer is formed on both sides of the substrate. The sacrificial layer and the substrate are etched to form an opening extending through the substrate. In embodiments that include forming the first cell prior to forming the gate via, the opening exposes a portion of a gate structure of the first cell. The opening is then filled by one or more deposition processes in order to form the S/D connect. In some embodiments, the deposition processes include CVD, PVD, ALD, sputtering or another suitable deposition process. In some embodiments, a removal process, such as etching or planarization is performed to remove material of the gate via over a surface of the sacrificial layer farthest from the substrate. In some embodiments, the sacrificial layer is removed from at least one side of the substrate following formation of the gate via. In some embodiments, the gate via has parallel sidewalls and a substantially uniform width. In some embodiments, the gate via has a tapered profile.

In some embodiments, the gate via includes a fill material including cobalt (Co), tungsten (W), copper (Cu), ruthenium (Ru), titanium (Ti), tantalum (Ta), or alloys thereof, or other conductive materials. In some embodiments, the gate via includes a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, the gate via connects to a gate structure of the first active region and the second active region through a silicide layer (not shown). In some embodiments, a composition of the S/D connect via is a same composition as the gate via. In some embodiments, the composition of the S/D connect via is different from the composition of the gate via.

In operation 720, the substrate is flipped. In some embodiments, the substrate is flipped using a robot arm and/or a vacuum chuck. Flipping the substrate exposes a second side of the substrate for processes. In some embodiments where the S/D connect via and/or the gate via is formed after the first cell, the substrate is flipped prior to forming the S/D connect via and/or the gate via. In some embodiments wherein the S/D connect via and/or the gate via is formed prior to the first cell, the substrate is flipped after forming the first cell.

In operation 725, a second cell is formed on the second side of the substrate. The second cell is formed using a series of deposition and patterning processes. In some embodiments, the deposition processes include CVD, PVD, ALD, sputtering or another suitable deposition process. In some embodiments, the patterning processes include lithographic and etching processes, such as dry or wet etching. In some embodiments, the second cell includes NS and an interconnect structure. Forming the second cell includes forming an S/D electrode of the second cell electrically connected to the S/D connect via and forming a gate structure of the second cell electrically connected to the gate via. In some embodiments, a functionality of the first cell is a same functionality as the second cell. In some embodiments, the first cell has different functionality from the second cell. In some embodiments, the first cell and the second cell are used in combination to implement a designed functionality.

Figure 7B:
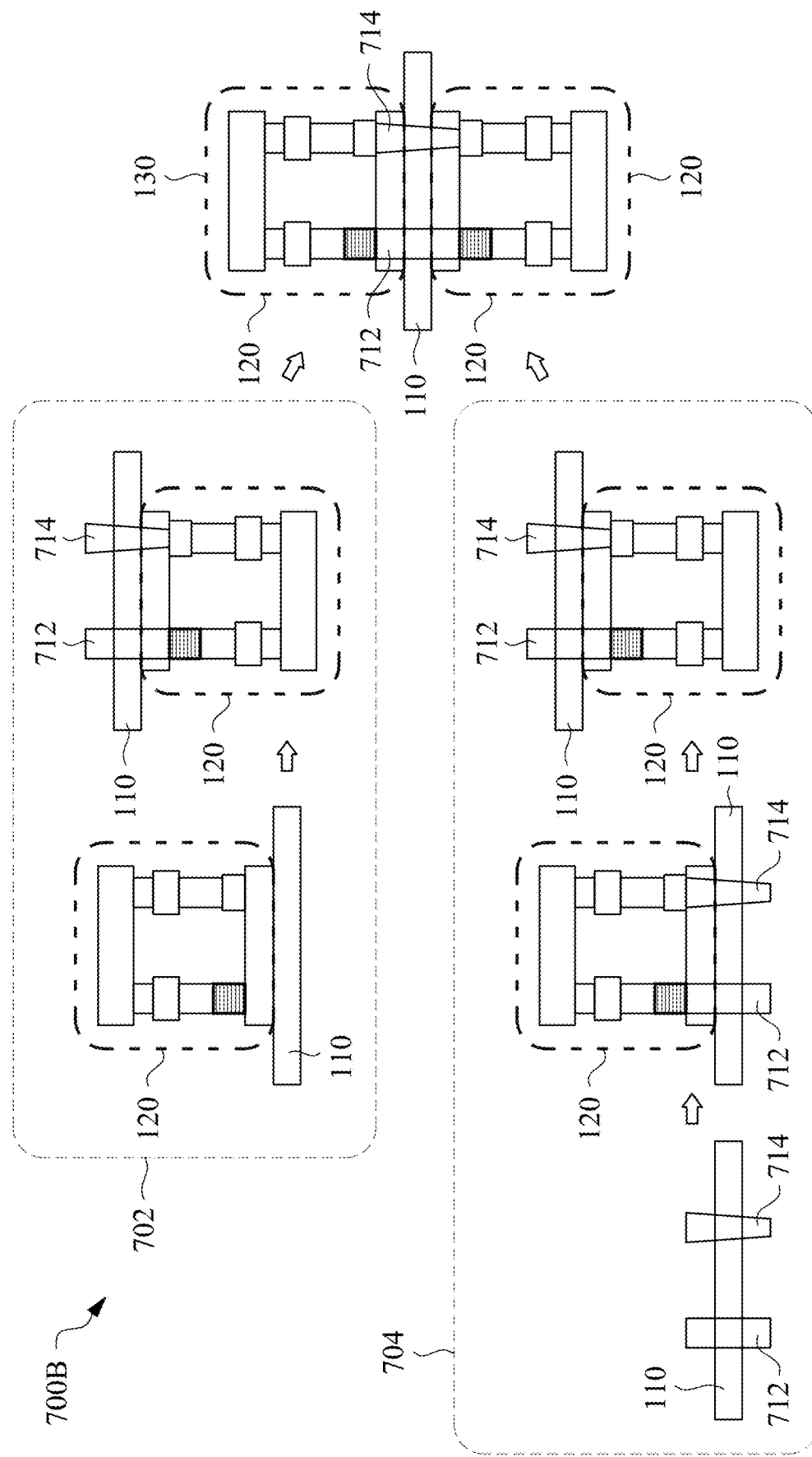
FIG. 7B is a series of cross-sectional views of a semiconductor device at various stages of manufacture, in accordance with some embodiments.

FIG. 7B is a series of cross-sectional views of a semiconductor device 700B at various stages of manufacture in accordance with some embodiments. FIG. 7B includes a first production track 702 and a second production track 704. Both the first production track 702 and the second production track 704 produce a same final structure as indicated in FIG. 7B.

In the first production track 702, the first cell 120 is formed on a first side of the substrate 110. The substrate 110 is then flipped and the S/D connect via 712 and the gate via 714 are formed to electrically connect to the first cell 120 through the substrate 110. The second cell 130 is then formed on the second side of the substrate 110 to electrically connect to the first cell 120 through the S/D connect via 712 and the gate via 714. In some embodiments, the first production track 702 is implemented by performing operations 705, 720, 710, 715 and 725 of method 700A (FIG. 7A) in this order. In some embodiments, operations 710 and 715 are performed simultaneously.

In the second production track 704, the S/D connect via 712 and the gate via 714 are formed through the substrate 110. The first cell 120 is then formed on the first side of the substrate 110 to electrically connect to the S/D connect via 712 and the gate via 714. The substrate 110 is then flipped and the second cell 130 is formed on the second side of the substrate 110 to electrically connect to the first cell 120 through the S/D connect via 712 and the gate via 714. In some embodiments, the second production track 704 is implemented by performing operations 710, 715, 705, 720 and 725 of method 700A (FIG. 7A) in this order. In some embodiments, operations 710 and 715 are performed simultaneously.

Figure 8:
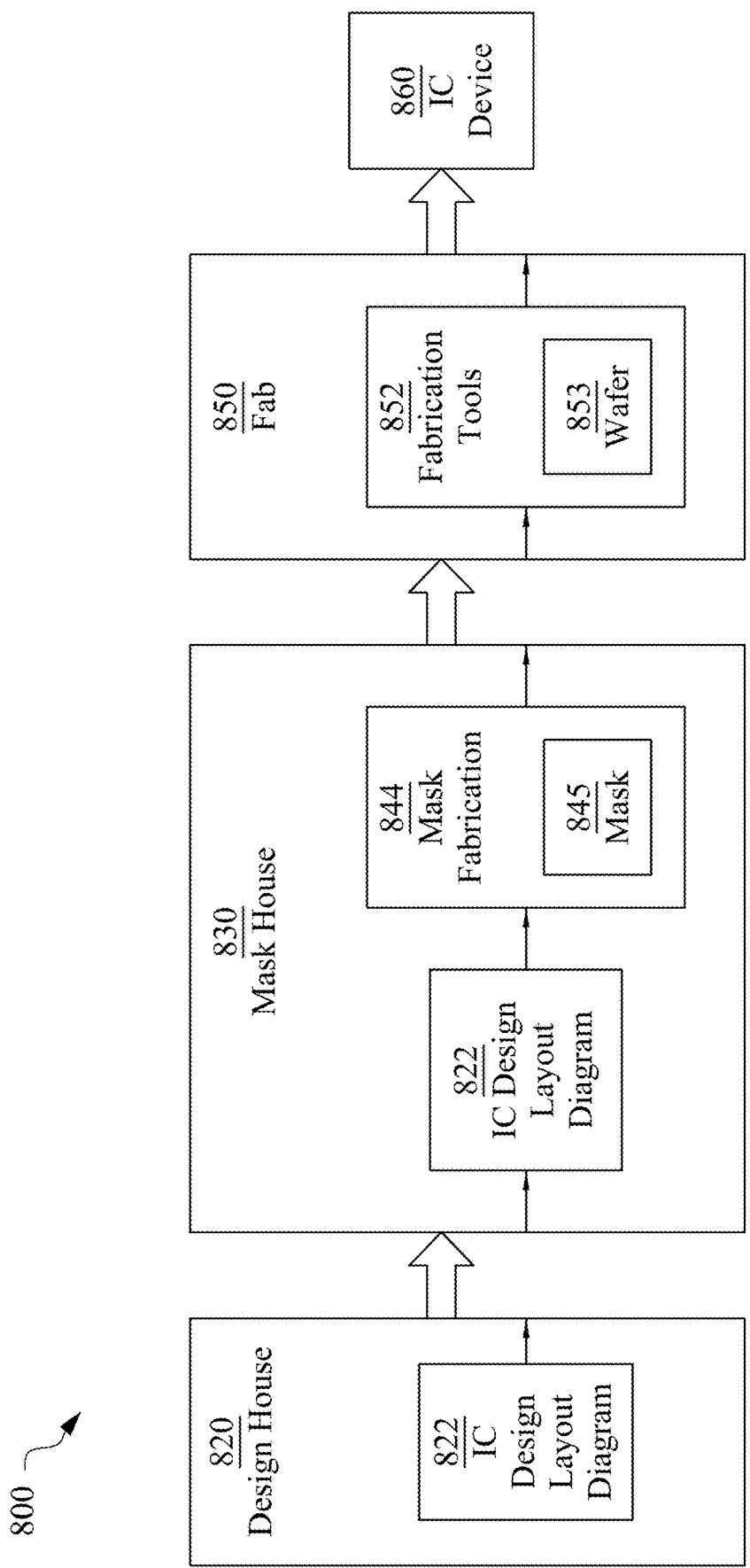
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in IC manufacturing system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or a design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain region of the channel bar, source electrode, and drain electrode, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as a mask 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 1445 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Figure 9:
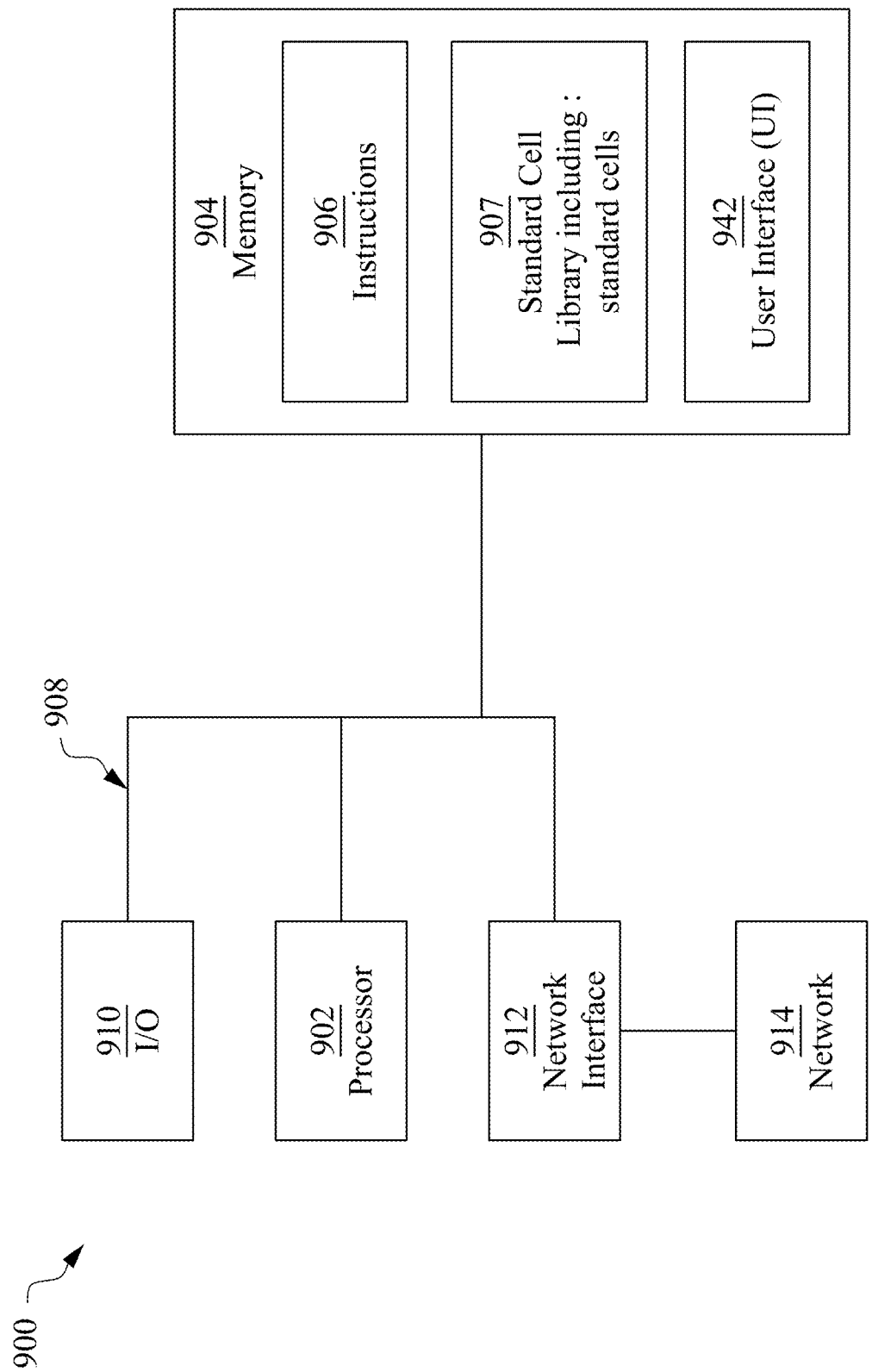
FIG. 9 is a block diagram of an electronic design automation (EDA) system, in accordance with some embodiments.

FIG. 9 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a processor 902 and a non-transitory, computer-readable storage medium 904. Computer-readable storage medium 904 is, amongst other things, encoded with, i.e., stores, computer program code 906, i.e., a set of executable instructions. Execution of computer program code 906 by processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause EDA system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause EDA system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows EDA system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 900.

EDA system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in storage medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Details regarding an integrated circuit (IC) manufacturing system (e.g., EDA system 900 of FIG. 9), and an IC manufacturing flow associated therewith are found, e.g., in U.S. Pat. No. 9,256,709, granted Feb. 9, 2016, U.S. Pre-Grant Publication No. 20178429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of this description relates to a semiconductor device. The semiconductor device includes a substrate. The semiconductor device further includes a first cell, wherein the first cell has a first functionality. The first cell includes a first portion on a first side of the substrate, wherein the first portion comprises a first conductive element; a second portion on a second side of the substrate opposite the first side, wherein the second portion comprises a second conductive element; and a first conductive via extending through the substrate, wherein the first conductive via electrically connects the first conductive element to the second conductive element. The semiconductor device further includes a second cell, wherein the second cell has a second functionality. The second cell includes a third portion on the first side of the substrate, wherein the third portion comprises a third conductive element; a fourth portion on the second side of the substrate, wherein the fourth portion comprises a fourth conductive element; and a second conductive via extending through the substrate, wherein the second conductive via electrically connects the third conductive element to the fourth conductive element. In some embodiments, the first cell has a first layout type, and the second cell has a second layout type. In some embodiments, the first portion has a first layout type, and the second portion has a second layout type. In some embodiments, the first cell is a horizontal stacked cell, including two signal lines, and having a large width channel, and the second cell is a vertical mirrored, includes 4 signal lines, and has a small width of the channel. In some embodiments, the semiconductor device further includes a third cell, and the third cell includes a fifth portion on the first side of the substrate, wherein the fifth portion comprises a fifth conductive element; a sixth portion on the second side of the substrate, wherein the sixth portion comprises a sixth conductive element; and a third conductive via extending through the substrate, wherein the third conductive via electrically connects the fifth conductive element to the sixth conductive element. In some embodiments, the first cell has a first layout type, the second cell has a second layout type, the third cell has a third layout type, and the third layout type is different from at least one of the first layout type or the second layout type. In some embodiments, the first cell is spaced from the second cell in a first direction, the first cell is spaced from the third cell in a second direction perpendicular to the first direction, and the third layout type is different from the first layout type. In some embodiments, the second cell is spaced from the first cell in a first direction, the second cell is spaced from the third cell in a second direction perpendicular to the first direction, and the third layout type is different from the second layout type. In some embodiments, the first conductive element includes a first source/drain (S/D) electrode, and the second conductive element includes a second S/D electrode. In some embodiments, the first conductive element includes a first gate electrode, and the second conductive element includes a second gate electrode.

An aspect of this description relates to a semiconductor device. The semiconductor device includes a substrate. The semiconductor device further includes a first cell on a first side of the substrate, wherein the first cell has a first component having a first threshold voltage, and the first cell has a first poly pitch. The semiconductor device further includes a second cell on the first side of the substrate, wherein the second cell has a second component having a second threshold voltage, and the second cell has a second poly pitch. The semiconductor device further includes a third cell on a second side of the substrate opposite the first side of the substrate, wherein the third cell has a third component for receiving a third threshold voltage, the third cell has a third poly pitch, and the second side of the substrate is free of cells comprising components having the first threshold voltage or the second threshold voltage. In some embodiments, the second threshold voltage is equal to the first threshold voltage. In some embodiments, the second threshold voltage is different from the first threshold voltage. In some embodiments, the first poly pitch is equal to the second poly pitch, and the third poly pitch is different from each of the first poly pitch and the second poly pitch. In some embodiments, the first poly pitch is different from the second poly pitch, and the third poly pitch is different from each of the first poly pitch and the second poly pitch. In some embodiments, the first side of the substrate is free of cells having components having the third threshold voltage. In some embodiments, the first poly pitch is an integer multiple of the second poly pitch.

An aspect of this description relates to a method of making a semiconductor device. The method includes forming a first device on a first side of a substrate, wherein the first device comprises a first source/drain (S/D) electrode. The method further includes forming a second device on a second side of the substrate, wherein the second side of the substrate is opposite to the first side of the substrate, and the second device includes a gate electrode. The method further includes forming a through substrate via (TSV) at a location selected using an automatic placement and routing (APR) tool, wherein the TSV electrically connects the first S/D electrode and the gate electrode. In some embodiments, selecting forming the TSV includes forming the TSV satisfying design rules for the first side of the substrate and design rules for the second side of the substrate. In some embodiments, forming the first device includes forming a first inverter, and forming the second device includes forming a second inverter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate;
a first cell, wherein the first cell has a first functionality, and the first cell comprises:
  a first portion on a first side of the semiconductor substrate, wherein the first portion comprises a first conductive element, and the first conductive element comprises a gate electrode or a source/drain electrode;
  a second portion on a second side of the semiconductor substrate opposite the first side, wherein the second portion comprises a second conductive element; and
  a first conductive via extending through the semiconductor substrate, wherein the first conductive via electrically connects the first conductive element to the second conductive element; and
a second cell, wherein the second cell has a second functionality, and the second cell comprises:
  a third portion on the first side of the semiconductor substrate, wherein the third portion comprises a third conductive element;
  a fourth portion on the second side of the semiconductor substrate, wherein the fourth portion comprises a fourth conductive element; and
  a second conductive via extending through the semiconductor substrate, wherein the second conductive via electrically connects the third conductive element to the fourth conductive element.

2. The semiconductor device of claim 1, wherein the first cell has a first layout type, and the second cell has a second layout type.

3. The semiconductor device of claim 1, wherein the first portion has a first layout type, and the second portion has a second layout type.

4. The semiconductor device of claim 1, wherein the first cell is a horizontal stacked cell, including two signal lines, and having a first channel width, and the second cell is vertical mirrored, includes 4 signal lines, and has a small second channel width less than the first channel width.

5. The semiconductor device of claim 1, further comprising a third cell, wherein the third cell comprises:
  a fifth portion on the first side of the semiconductor substrate, wherein the fifth portion comprises a fifth conductive element;
  a sixth portion on the second side of the semiconductor substrate, wherein the sixth portion comprises a sixth conductive element; and
  a third conductive via extending through the semiconductor substrate, wherein the third conductive via electrically connects the fifth conductive element to the sixth conductive element.

6. The semiconductor device of claim 5, wherein the first cell has a first layout type, the second cell has a second layout type, the third cell has a third layout type, and the third layout type is different from at least one of the first layout type or the second layout type.

7. The semiconductor device of claim 6, wherein the first cell is spaced from the second cell in a first direction, the first cell is spaced from the third cell in a second direction perpendicular to the first direction, and the third layout type is different from the first layout type.

8. The semiconductor device of claim 6, wherein the second cell is spaced from the first cell in a first direction, the second cell is spaced from the third cell in a second direction perpendicular to the first direction, and the third layout type is different from the second layout type.

9. The semiconductor device of claim 1, wherein the first conductive element includes a first source/drain (S/D) electrode, and the second conductive element includes a second S/D electrode.

10. The semiconductor device of claim 1, wherein the first conductive element includes a first gate electrode, and the second conductive element includes a second gate electrode.

11. A semiconductor device comprising:
a semiconductor substrate;
a first cell, wherein the first cell has a first threshold voltage, and the first cell comprises:
  a first conductive element on a first side of the semiconductor substrate;
  a second conductive element on a second side of the semiconductor substrate opposite the first side; and
  a first conductive via extending through the semiconductor substrate, wherein the first conductive via electrically connects the first conductive element to the second conductive element; and
a second cell, wherein the second cell has a second threshold voltage, and the second cell comprises:
  a third conductive element on the first side of the semiconductor substrate;
  a fourth conductive element on the second side of the semiconductor substrate; and
  a second conductive via extending through the semiconductor substrate, wherein the second conductive via electrically connects the third conductive element to the fourth conductive element.

12. The semiconductor device of claim 11, wherein the first conductive element comprises a gate electrode.

13. The semiconductor device of claim 11, wherein the first conductive element comprises a source/drain electrode.

* * * * *